(12) United States Patent
Naitoh et al.

(10) Patent No.: US 6,441,474 B2
(45) Date of Patent: Aug. 27, 2002

(54) SEMICONDUCTOR DEVICE AND LIQUID CRYSTAL MODULE ADOPTING THE SAME

(75) Inventors: Katsuyuki Naitoh, Shiki-gun; Kenji Toyosawa, Ikoma, both of (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/822,219

(22) Filed: Apr. 2, 2001

(30) Foreign Application Priority Data

Apr. 7, 2000 (JP) ........................................ 2000-106959

(51) Int. Cl.$^7$ .............................................. H01L 23/02
(52) U.S. Cl. ........................ 257/678; 438/110; 257/783
(58) Field of Search ................................. 257/668, 783, 257/686, 782, 678, 787; 340/701, 794; 438/110; 361/720, 749, 783, 254

(56) References Cited

U.S. PATENT DOCUMENTS 6,011,315 A * 1/2000 Toyosaka et al. ........... 257/783
6,057,174 A * 5/2000 Hashimoto ................... 257/706
6,208,521 B1 * 3/2001 Nakatsuka ................... 361/749
6,246,114 B1 * 6/2001 Takahashi et al. .......... 257/696

FOREIGN PATENT DOCUMENTS

JP          3-57233           3/1991

* cited by examiner

*Primary Examiner*—Hoai Ho
*Assistant Examiner*—Long K. Tran
(74) *Attorney, Agent, or Firm*—Nixon & Vanderhye PC

(57) ABSTRACT

A semiconductor device of a TCP or COF configuration is provided, including semiconductor chips mounted on a tape, which realizes compact mounting of a plurality of semiconductor chips on a single tape. In order to so, a semiconductor chip having a lengthwise rectangular shape is mounted so as to have a long side substantially perpendicular to an extending direction of a Cu wiring pattern, thereby wiring numerous wires of the Cu wiring patterns substantially in parallel with each other, and substantially straight-line with respect to a destination of in/output. Further, in the mounting of the plurality of semiconductor chips, a tape width can be reduced so as to miniaturize devices to be connected.

27 Claims, 15 Drawing Sheets

SEMICONDUCTOR DEVICE AND LIQUID CRYSTAL MODULE ADOPTING THE SAME

FIELD OF THE INVENTION

The present invention relates to a package configuration of a semiconductor device which employs a tape in the mounting of a semiconductor chip, and to a liquid crystal module incorporating the semiconductor device.

BACKGROUND OF THE INVENTION

A liquid crystal display device used as a personal computer monitor, and portable devices such as a terminal device of a mobile phone and a game utilize a tape for mounting a semiconductor chip called TAB (Tape Automated Bonding). In addition, in this mounting is adopted a package configuration such as a TCP (Tape Carrier Package) and a COF (Chip on Film). Note that, an example of the mounting of a semiconductor chip according to the TAB is disclosed in Japanese Unexamined Patent Publication No. 57233/1991 (Tokukaihei 3-57233 published on Mar. 12, 1991).

FIGS. 14 and 15 illustrate a conventional mounting method, of which FIG. 14 is a front view and FIG. 15 is a cross section of FIG. 14 taken along a cross sectional line A—A. FIGS. 14 and 15 show the TCP configuration. A tape 3 is formed by patterning a Cu wiring pattern 2 on a substrate 1 composed of an organic material such as polyimide. The Cu wiring pattern 2 has extending portions 2a and 2b which are extending from peripheral portions of the substrate 1 so as to be parallel to each other. Then, via an anisotropic conductive film and the like, the extending portions 2a and 2b are electrically connected to a pad of a liquid crystal panel and a pad of a power supply or a print board from which an image data signal is transmitted, respectively.

The substrate 1 includes device holes 6 and 7 corresponding to semiconductor chips 4 and 5 to be mounted. The Cu wiring pattern 2 is lead into these device holes 6 and 7 so as to be inner leads 2c. Portions of the Cu wiring pattern 2 such as the inner leads 2c and the extending portions 2a and 2b are given Sn plating (not shown). Corresponding to Au bumps 8 disposed on every side of semiconductor chips 4 and 5 each having a rectangular shape, the inner leads 2c project to the interior of the device holes 6 and 7 through the four sides of each rectangular hole. The Au bumps 8 of the semiconductor chips 4 an 5 are subject to eutectic bonding with the Sn which was applied to the inner leads 2c by electroless plating, that is called ILB (Inner Lead Bonding).

Periphery w including the device surfaces of the semiconductor chips 4 and 5, and the inner leads 2c thus mounted are sealed with a resin 9, thereby maintaining the mechanical strength while being protected from the surrounding environment. Note that, the tape 3 is protected by a covering of a solder resist 10, except for electrode portions thereof such as the inner leads 2c. The foregoing processes are sequentially performed while remaining on the tape 3, thereby efficiently performing mounting.

Meanwhile, electric devices have been given enhanced functions in recent years, which calls for multi-chip mounting on a single tape as discussed. In liquid crystal modules to be mounted on small devices, such as, for example, terminal devices of mobile phones and games, in order to realize efficient operations of a driver with respect to the increasing number of wires in a liquid crystal panel a memory is provided first in an IC of the driver. This results in an increase in memory capacity due to a further increase in the number of pixels and adopting of colors. For example, when manufacturing a common and segment driver and an SRAM according to a process (design rule) necessary for the common and segment driver, an SRAM portion occupies 60% of the whole area of a semiconductor chip.

On the other hand, though the driver portion that is required to be resistant to pressure in order to control contrast in pixels of a liquid crystal panel is not suitable for manufacture by minuscule processing, yet adopting a minuscule process in the memory portion enables the memory portion to accommodate to integration which corresponds to the number of wires in the liquid crystal panel. Therefore, it is feasible that the driver portion and the memory portion are formed by an optimum process (design rule), while mounting two semiconductor chips, a driver chip and an SRAM chip, on a single tape.

However, in the foregoing mounting configuration, the Au bumps 8 of the semiconductor chips 4 and 5 are disposed on the periphery of the semiconductor chips 4 and 5 having the rectangular shape, for the ILB. In correspondence with this, the inner leads 2c project to the interior of the device holes 6 and 7 through all the four sides of each rectangular hole, thereby accommodating to a high-density arrangement of the Cu wiring pattern 2. This raises a problem such that, of all the four sides of each of the device holes 6 and 7, through a side orthogonal to the extending portions 2a and 2b can be formed the straight Cu wiring pattern 2; however, with regard to a side parallel to the extending portions 2a and 2b, the routing of the Cu wiring pattern 2 becomes complicated, thereby resulting in a process defect in the tape 3 and an increase in the size of the tape 3 due to the necessity for routing space.

This kind of problem emerges when mounting the semiconductor chips 4 and 5 individually on the tape 3, and becomes more pronounced in the mounting of a plurality of semiconductor chips 4 and 5. Accordingly, multi-chip mounting cannot easily be realized due to the foregoing problems, though it has been called for.

SUMMARY OF THE INVENTION

It is an object of the present invention to provide a semiconductor device capable of compact mounting of a plurality of semiconductor chips on a single tape, and a liquid crystal module adopting the semiconductor device.

The semiconductor device of the present invention is made up of a tape having an organic substrate and a wiring pattern formed on the organic substrate, and a plurality of semiconductor chips mounted on the tape, where the semiconductor chips individually have a lengthwise rectangular shape, and the semiconductor chips having the lengthwise rectangular shape are mounted so as to have a long side substantially perpendicular to an extending direction of the wiring pattern.

With the foregoing arrangement, the semiconductor device having a TCP or COF configuration, including semiconductor chips mounted on a tape, is mounted in such a manner that each semiconductor chip having the lengthwise rectangular shape has bumps along its long side which is substantially perpendicular to the extending direction of the wiring pattern.

Accordingly, numerous wires of the wiring pattern can be provided so as to be substantially parallel to each other and substantially straight to a destination of in-/output. Particularly, when the semiconductor chips have no complicated routing therebetween, and the chips are connected in a substantially straight-line wiring pattern, an interval between the chips can be reduced. Accordingly, in the mounting of a plurality of semiconductor chips, devices to be connected can be reduced in size by reducing a width of the tape.

Further, the semiconductor device of the present invention has an arrangement in which the semiconductor chips have a difference in thickness.

With the foregoing arrangement, bonding is performed on a thinner semiconductor chip first, thereby reducing the risk of damage to the semiconductor chip as a result of contact with a bonding tool (bonder equipment).

Consequently, the semiconductor chips can be mounted in the vicinity, while reducing restriction on a mounting position of a chip, and allows a spacious design, for example, in the routing of the wiring pattern.

Furthermore, in the semiconductor device of the present invention, on the tape is formed a slit between the semiconductor chips, so as to ease bending of the tape.

With the foregoing arrangement, flexibility can be improved in composition such that the tape is bent with respect to a back side of a liquid crystal panel to be connected.

Further, the semiconductor of the present invention has an arrangement in which a wiring pattern between the semiconductor chips is free from a solder resist for ease of bending.

With the foregoing arrangement, since the solder resist is not formed over the wiring pattern between the semiconductor chips, it is less feasible that bending the tape at a portion free from the solder resist may result in a break in the wiring pattern, thereby improving flexibility in composition such that the tape is bent with respect to the back side of the liquid crystal panel to be connected.

Furthermore, the semiconductor device of the present invention has an arrangement in which the semiconductor chips are at least two chips selected from an SRAM, a liquid crystal driver IC and a controller-use IC.

With the foregoing arrangement, for example, more elements are required in comparison with a DRAM (dynamic RAM) and the like; however, the semiconductor device is made up of two chips one of which is the liquid crystal driver IC and the other is the SRAM (static RAM) suitable as a memory capable of low power consumption and being provided adjacent to the liquid crystal driver IC.

Alternatively, the semiconductor device may have three chips: the SRAM, the liquid crystal driver IC and the controller-use IC. Alternatively, the semiconductor device may have two of these chips arbitrary selected.

Further, the liquid crystal module of the present invention includes any one of the foregoing semiconductor devices that is connected to a liquid crystal panel.

Additional objects, features, and strengths of the present invention will be made clear by the description below. Further, the advantages of the present invention will be evident from the following explanation in reference to the drawings.

DESCRIPTION OF THE EMBODIMENTS

The following will explain a First Embodiment of the present invention with reference to FIGS. 1 to 5.

Figure 1:
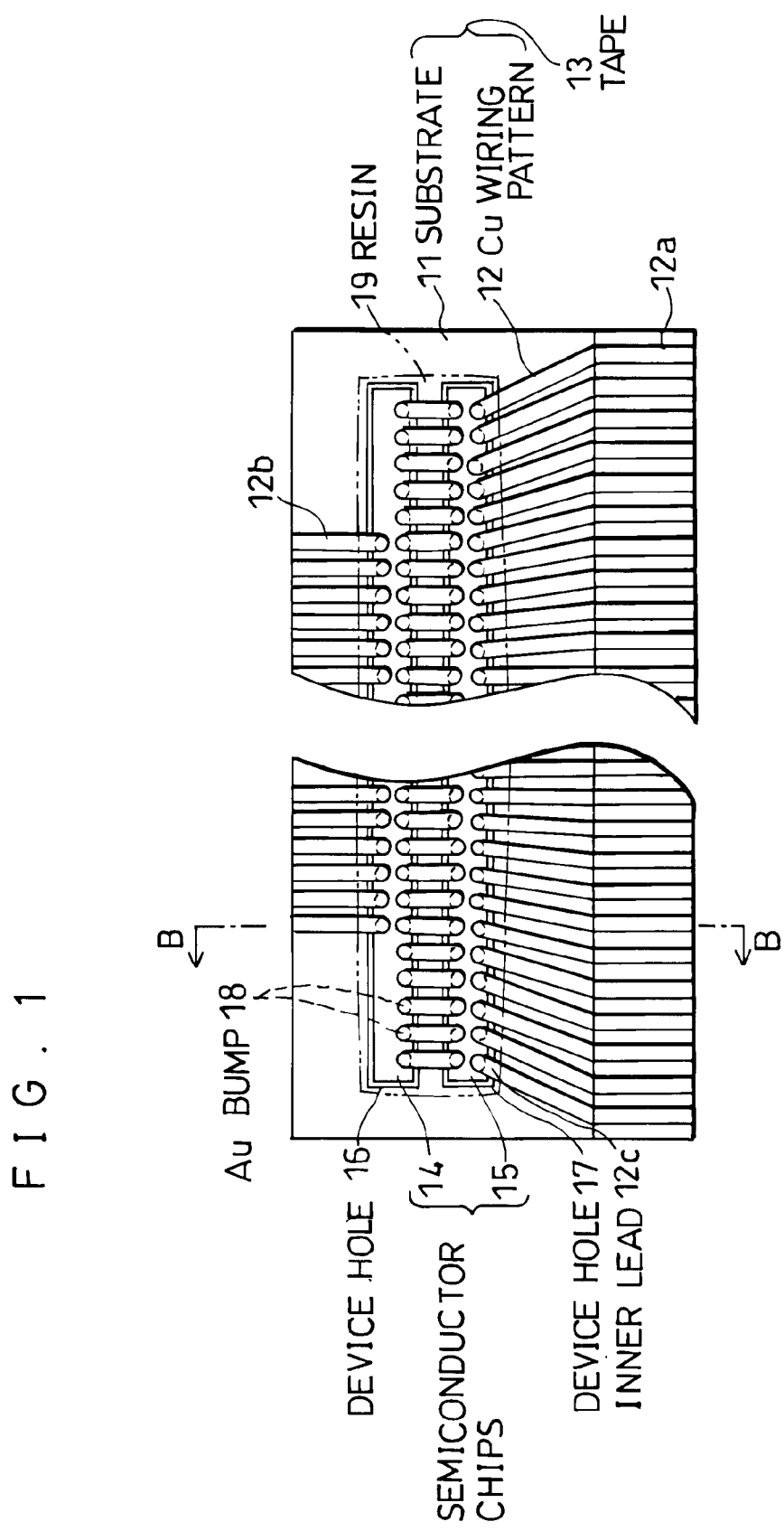
FIG. 1 is a front view of a semiconductor device according to a First Embodiment of the present invention.
Figure 2:
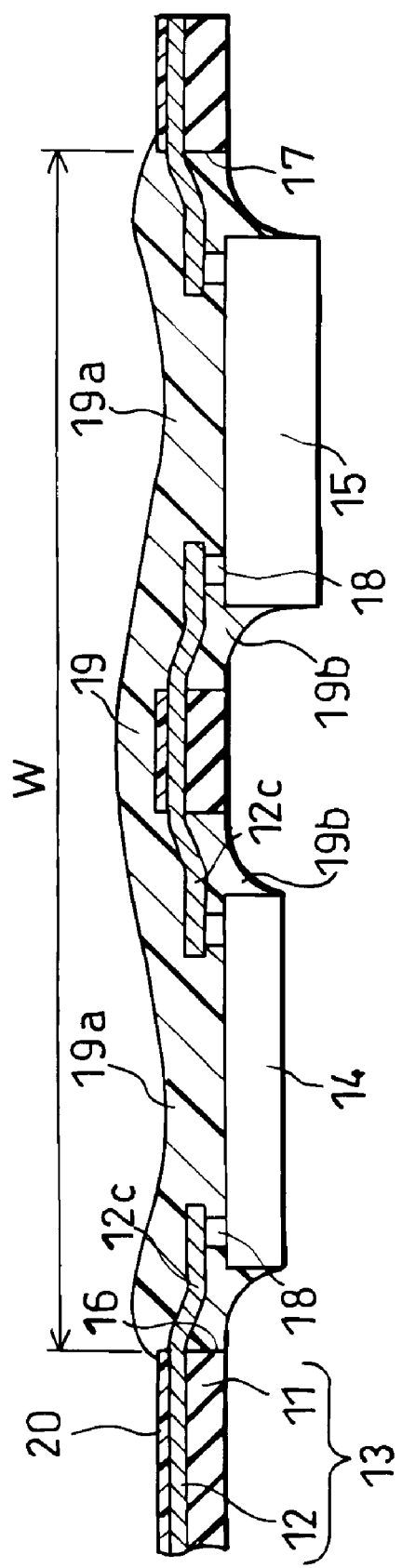
FIG. 2 is a cross sectional view of the semiconductor device of FIG. 1, taken along the line B—B.

FIG. 1 is a front view of a semiconductor device according to the First Embodiment of the present invention, and FIG. 2 is a cross sectional view of this semiconductor device, taken along a line B—B. A surface of a substrate (organic base material) 11 composed of an organic material such as polyimide is patterned to have a Cu wiring pattern (wiring pattern) 12, thereby forming a tape 13. The Cu wiring pattern 12 has extending portions 12a and 12b which are extended parallel to each other from a peripheral portion of the substrate 11, so that the extending portions 12a and 12b are electrically and mechanically connected respectively to an electrode of a liquid crystal panel 30 (shown in FIG. 5) and an electrode of a power supply or a print board from which an image data signal is transmitted, via an anisotropic conductive film and the like in-between.

On the substrate 11 are formed device holes 16 and 17 in correspondence with semiconductor chips 14 and 15 to be mounted. The Cu wiring pattern 12 is lead into the device holes 16 and 17, thereby becoming inner leads 12c. Portions of the Cu wiring pattern 12 such as the inner lead 12c and the extending portions 12a and 12b are given Sn plating (not shown).

In the present invention, the semiconductor chips 14 and 15 individually have a lengthwise rectangular shape whose aspect ratio (a ratio of a long side to a short side) is not less than 10. The semiconductor chips 14 and 15 are mounted so as to be substantially perpendicular to an extending direction of the Cu wiring pattern 12. The inner leads 12c, in correspondence with Au bumps 18 disposed along each long side of the semiconductor chips having the lengthwise rectangular shape, project to the interior of each of the device holes 16 and 17. The Au bumps of the semiconductor chips 14 and 15 are subject to eutectic bonding with the Sn which was applied to the inner leads 12c by electroless plating, thus connected by the ILB.

Figure 8:
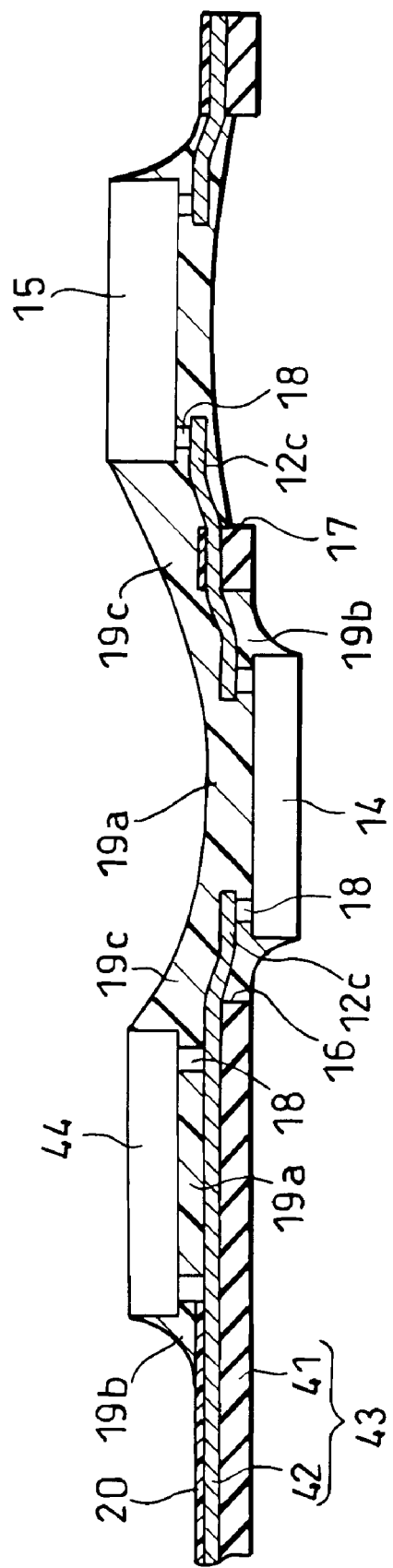
FIG. 8 is a cross sectional view of a semiconductor device according to a Third Embodiment of the present invention.

The semiconductor chip 14 is an SRAM having, for example, a chip area of 16 mm×1.6 mm and a thickness of 400 μm, which is manufactured according to a process (design rule) of not more than 0.35 μm. Further, the semiconductor chip 15 is a driver IC having, for example, a chip area of 11 mm×1 mm and a thickness of 625 μm, which is manufactured according to a process (design rule) of 0.65 μm. The SRAM requires more elements than a DRAM and others, but is capable of low power consumption and desirable as a memory to be disposed adjacent to a liquid crystal driver IC. In addition, by thus having the lengthwise rectangular shape, the SRAM can be disposed adjacent to the driver IC. Note that, either one of the semiconductor chips 14 and 15 may be a controller-use IC which may alternatively be provided in addition to the SRAM and the liquid crystal driver IC as being the semiconductor chips 14 and 15, respectively. When thus providing the controller-use IC in addition to the SRAM a nd the liquid c rystal driver IC as the semiconductor chips 14 and 15, respectively, for example, an arrangement as shown in FIG. 8 to be discussed later is available, where a semiconductor chip 44 serves as the controller-use IC. Note that, the controller-use IC herein has a function which will be explained below. For example, in order to perform display on a screen in a TFT liquid crystal panel, it is necessary to distribute a voltage to be applied to each pixel with respect to every pixel for display of a certain image at a timing corresponding to the display of the image. The controller-use IC has the function to make this timing.

In the present invention, it is the semiconductor chip 14 which is bonded first, which is followed by the bonding of the semiconductor chip 15 by the same bonding tool. Thus, a difference in thickness between these two semiconductor chips 14 and 15 is preferably not less than 200 μm, thereby reducing potential damages such as a damage on the semiconductor chip 14 that has been bonded first, given by a contact with the bonding tool when bonding the semiconductor chip 15 for the second time. This enables the semiconductor chips 14 and 15 to be mounted in the vicinity, greatly reduces restriction on a mounting position of a chip, and allows a spacious design, for example, in the routing of the Cu wiring pattern 12.

Note that, the smaller a mounting interval between the semiconductor chips 14 and 15 is, the tape 13 can also have a smaller width; however, taking into consideration an interaction with the bonding tool, the mounting interval needs to be in a range of 0.5 mm to 3 mm. Conditions for the ILB was such that a connection load per a bump is 30 gf, connection time is 3 seconds, and a bonding tool has a temperature of 400° C., thereby attaining electrical conduction between the Cu wiring pattern 12 including 100 wires or more and the semiconductor chips 14 and 15.

Figure 3:
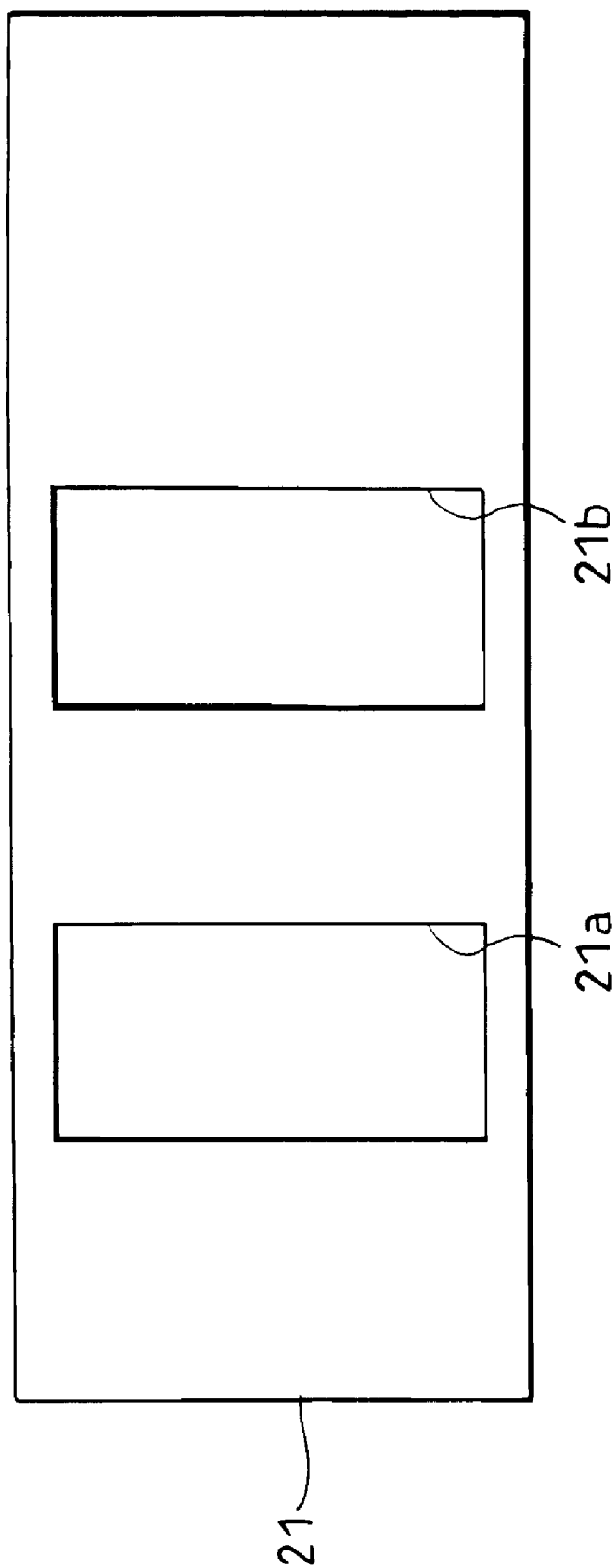
FIG. 3 is a front view of a plate used in ILB.
Figure 4:
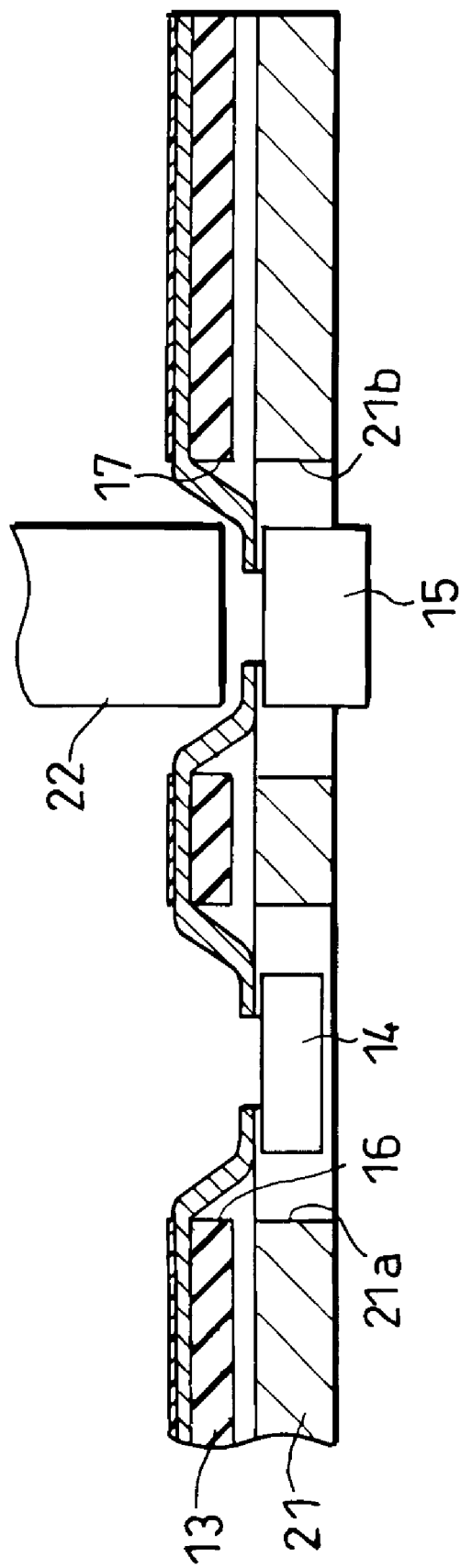
FIG. 4 is a cross sectional view showing a mounting state of chips.

FIG. 3 is a front view of a plate 21 which is used in the ILB, and FIG. 4 is a cross sectional view showing a mounting state of chips. This plate 21 is made of, for example, an invar material (an alloy containing 36% of Ni and 64% of Fe) having a film thickness of 0.5 mm, and have blanks 21a and 21b respectively corresponding to the sizes of, and the interval between, the semiconductor chips 14 and 15 to be connected by the ILB. After mutually positioning the device holes 16 and 17, and the blanks 21a and 21b of the plate 21, connection is made by the ILB under the foregoing conditions. The plate 21 supports the tape 13, thereby preventing distortion such as deformation due to bending in the tape 13 which may occur when pressed by a tool 22 in the bonding.

Periphery W including device surfaces of the semiconductor chips 14 and 15 thus mounted, and the inner leads 12c are sealed with a resin 19, thereby maintaining the mechanical strength while being protected from the surrounding environment. The sealing with resin is performed as follows: after the ILB, the required amount of liquid resin, 30 mg per 5 seconds for example, is dropped from the device surfaces of the semiconductor chips 14 and 15, thereafter performing thermal processing at 120° C. for 20 minutes. Accordingly, the device surfaces of the semiconductor chips 14 and 15 are covered as indicated by a reference numeral 19a, while forming a fillet 19b on a side with resin seeped through the device surfaces. Allowing resin to be set on the device surfaces and the sides of the semiconductor chips 14 and 15 realizes a firmer hold and seal.

Note that, the tape 13 is protected by a covering of a solder resist 20, except for electrode portions thereof such as the inner leads 12c. The foregoing processes are sequentially performed while the semiconductor chips 14 and 15 remain on the tape 3, thereby efficiently performing mounting.

Figure 5:
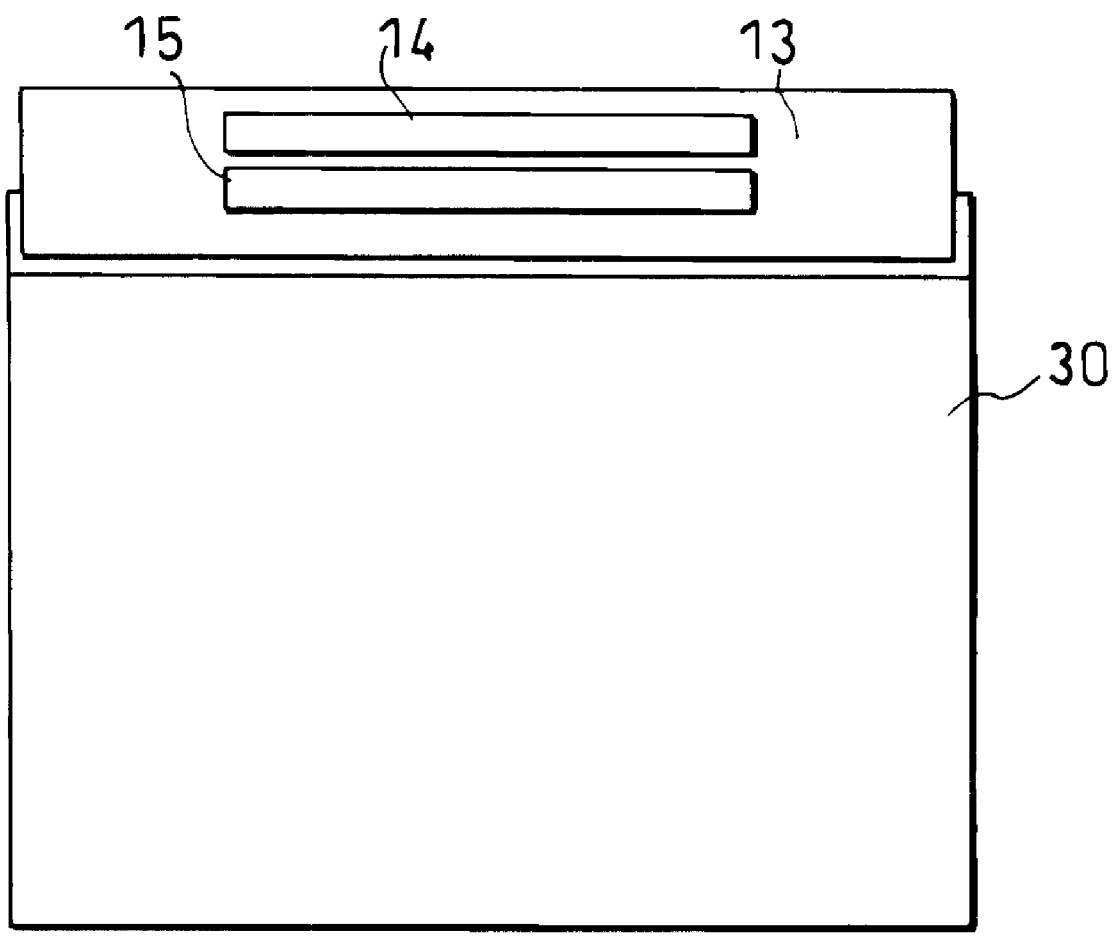
FIG. 5 is a front view of a liquid crystal module which is one mounting example of the semiconductor device shown in FIGS. 1 to 4.

FIG. 5 is a front view of a liquid crystal module which is one mounting example of the semiconductor device having the foregoing arrangement. This liquid crystal module is used as a display of a terminal device of a cellular phone, which includes a liquid crystal panel 30 and the single tape 13 connected to each other. Note that the semiconductor device of FIG. 5 may be replaced by any of semiconductor devices according to Second to Fifth Embodiments to be discussed below.

As discussed, in the present invention, the semiconductor chips 14 and 15 having the lengthwise rectangular shape are mounted so as to be perpendicular to the extending direction of the Cu wiring pattern 12, thereby making it possible to dispose a plurality of wires of the Cu wiring pattern 12 so as to be substantially parallel to each other and substantially straight-line along the extending portions 12a and 12b. Particularly, in the case where there is no complicated routing between the semiconductor chips 14 and 15, where the both chips 14 and 15 are connected in a substantially straight-line wiring pattern, then the interval therebetween can be reduced. This enables the tape 13 and the semiconductor chips 14 and 15 to have a similar shape, and even when mounting a plurality of the semiconductor chips 14 and 15 the width of the tape 13 can be reduced. T]t]herefore, the size of the corrected device (the liquid crystal panel 30) can also be reduced.

In the present invention, the semiconductor chips 14 and 15 are given long sides so as to enable numerous Au bumps 18 as being I/O terminals on the semiconductor chips 14 and 15 to be disposed on the same row so that numerous wires of the Cu wiring pattern 12 as being output signal wiring can be routed straight toward the extending portions 12a and 12b. On the other hand, short sides are provided so that, when thus providing the long sides, as many chips as possible can be obtained from a wafer from which the semiconductor chips 14 and 15 are obtained, and a minimum area required to form elements and circuits within the semiconductor chips 14 and 15 can be secured. Taking these into consideration, it is preferable that the semiconductor chips 14 and 15 have an aspect ratio (a ratio of a long side to a short side) of not less than 10. More specifically, the semiconductor chips 14 and 15 having the aspect ratio of not less than 10 offer two advantages: (i) securing as many chips as obtainable from one wafer; and (ii) straight routing of the output signal wiring.

For example, when the semiconductor chips 14 and 15 have each a long side of about 17 mm, and when adopting a fine pitch having a minimum pad pitch of 50 μm, it is possible to secure about 540 I/O terminals. In this case, in order to secure the area corresponding to elements and circuits provided within the semiconductor chips 14 and 15 according to the process of the design rule of 0.65 μm, the semiconductor chips 14 and 15 each should have a short side of at least 1.6 mm.

Figure 6:
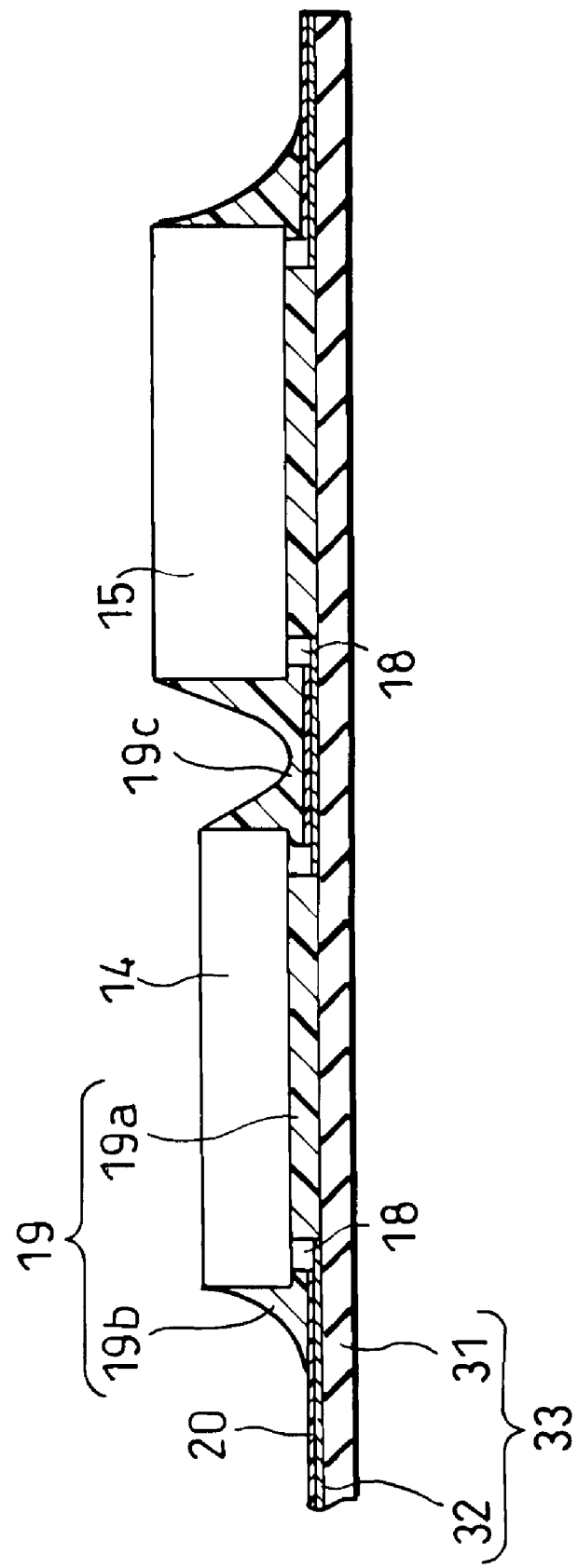
FIG. 6 is a cross sectional view of a semiconductor device according to a Second Embodiment of the present invention.
Figure 7:
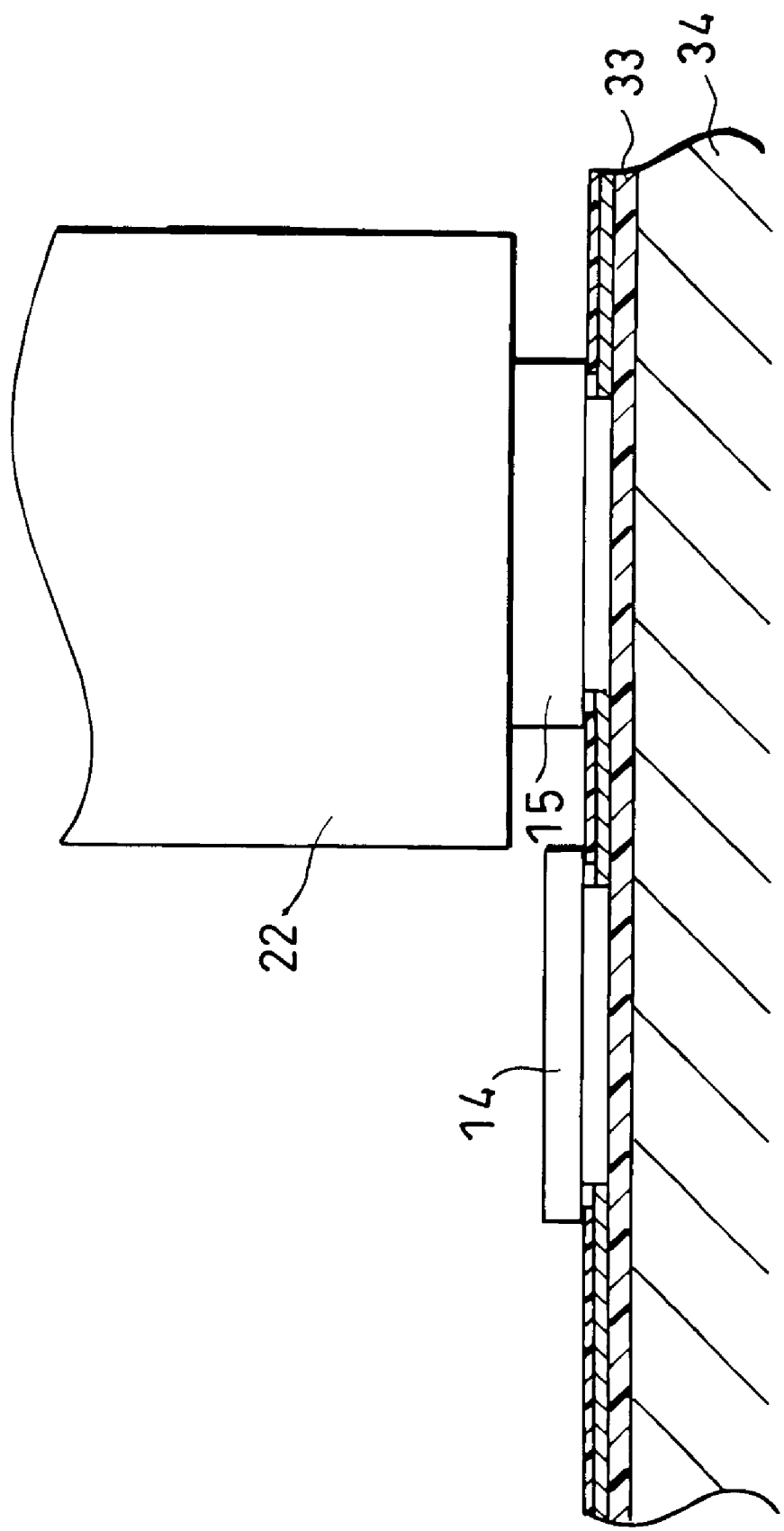
FIG. 7 is a cross sectional view showing a mounting state of chips.

The following will explain a Second Embodiment of the present invention with reference to FIGS. 6 and 7.

FIG. 6 is a cross sectional view of a semiconductor device according to the Second Embodiment of the present invention. In contrast to the TCP configuration adopted by the semiconductor device shown in FIGS. 1 to 4, the present semiconductor device adopts the COF configuration, but the corresponding members will be given the same reference numerals, and explanation thereof will be omitted here. A surface of a substrate 31 composed of the organic material is patterned to have a Cu wiring pattern 32, thereby forming a tape 33. The Cu wiring pattern 32 is given Ni plating (not shown) and, further, Au plating (not shown).

On the tape 33 is mounted the semiconductor chips 14 and 15 by flip chip bonding. The mounting, as shown in FIG. 7, is performed as follows: after positioning and placing the tape 33 on a base 34, the tool 22 is used to connect, for example, the Au bumps 18 and electrodes by Au—Au thermo-compression bonding. For example, conditions for the connection are, for example, 450° C., $170 \times 10^{-4}$ gf/m$^2$, and 2 seconds.

Thereafter, narrow spacings between the tape 33 and each of the semiconductor chips 14 and 15, and the surroundings of the semiconductor chips 14 and 15 are sealed with the resin 19. The sealing with resin is made in such a manner that liquid resin is continuously dropped from along long-side edges of the semiconductor chips 14 and 15 to a surface of the tape 33, so as to fill the spacings between the tape 33 and each of the semiconductor chips 14 and 15 as indicated by a reference numeral 19a according to capillary action, and further, a fillet 19b is formed on a side of the semiconductor chip 14 or 15. The setting conditions of the resin is the same as those in the ILB above. A fillet between the semiconductor chips 14 and 15 as indicated by a reference numeral 19c has an improved strength due to a linking state of the resin.

The present invention can thus be applied to the COF configuration.

The following will explain a Third Embodiment of the present invention with reference to FIG. 8.

FIG. 8 is a cross sectional view of a semiconductor device according to the Third Embodiment of the present invention. This semiconductor device is similar to the semiconductor device shown in FIGS. 1 to 4, 6 and 7, and the corresponding members will be given the same reference numerals, and explanation thereof will be omitted here. In the present semiconductor device, a surface of a substrate 41 composed of the organic material is patterned to have a Cu wiring pattern 42, thereby forming a tape 43. The tape 43 includes the device holes 16 and 17, thereby connecting the semiconductor chips 14 and 15 by the ILB. In addition, onto the tape 43 is connected a semiconductor chip 44 by the flip chip bonding. Namely, the present semiconductor device has the TCP and COF configurations in combination.

The semiconductor chips 15 and 44 are mounted on the side of the Cu wiring pattern 42, while the semiconductor chip 14 is mounted on the side of the substrate 41 (it may also be arranged such that the semiconductor chip 14 is mounted on the side of the Cu wiring pattern 42 and the semiconductor chip 15 is mounted on the side of the substrate 41). The semiconductor chips 14 and 15 are given the Au bumps 18 which are connected to the inner leads 12c subject to the Sn plating, by eutectic bonding. The semiconductor chip 44 has the Au bumps 18 which are connected to electrodes by the Au—Au thermo-compression bonding. The semiconductor chips 14 and 15 thus mounted on the tape 43 are adjacent to each other, and the resin is applied therebetween in the linking state as indicated by a reference numeral 19c, thereby improving the mechanical strength.

Figure 9:
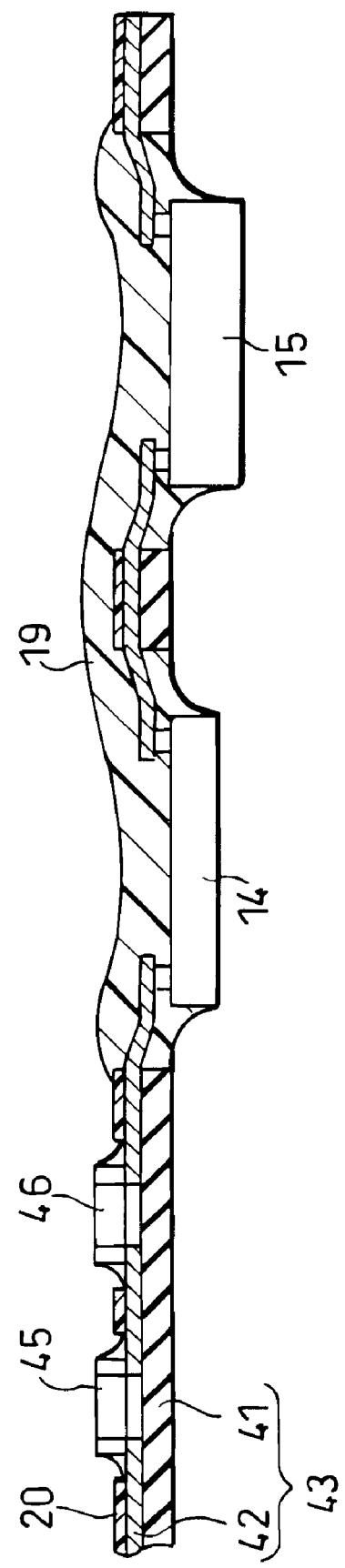
FIG. 9 is a cross sectional view of a semiconductor device according to a Fourth Embodiment of the present invention.

The following will explain a Fourth Embodiment of the present invention with reference to FIG. 9.

FIG. 9 is a cross sectional view of a semiconductor device according to the Fourth Embodiment of the present invention. This semiconductor device is similar to the semiconductor device shown in FIG. 8, and the corresponding members will be given the same reference numerals, and explanation thereof will be omitted. In the present semiconductor device, on the tape 43 are mounted one or more electric members 45 and 46 such as a resistor and a capacitor, other than the semiconductor chips 14 and 15. The electric members 45 and 46 are mounted in such a manner that soldering paste is initially printed with a metal mask, then, the electric members 45 and 46 are mounted next, which is followed by the application of solder in a thermal atmosphere at a peak temperature of 240° C. The two semiconductor chips 14 and 15 are mounted thereafter.

The electric members 45 and 46 may be mounted between the two semiconductor chips 14 and 15, and further, two or more pieces of the same member may be mounted.

Figure 10:
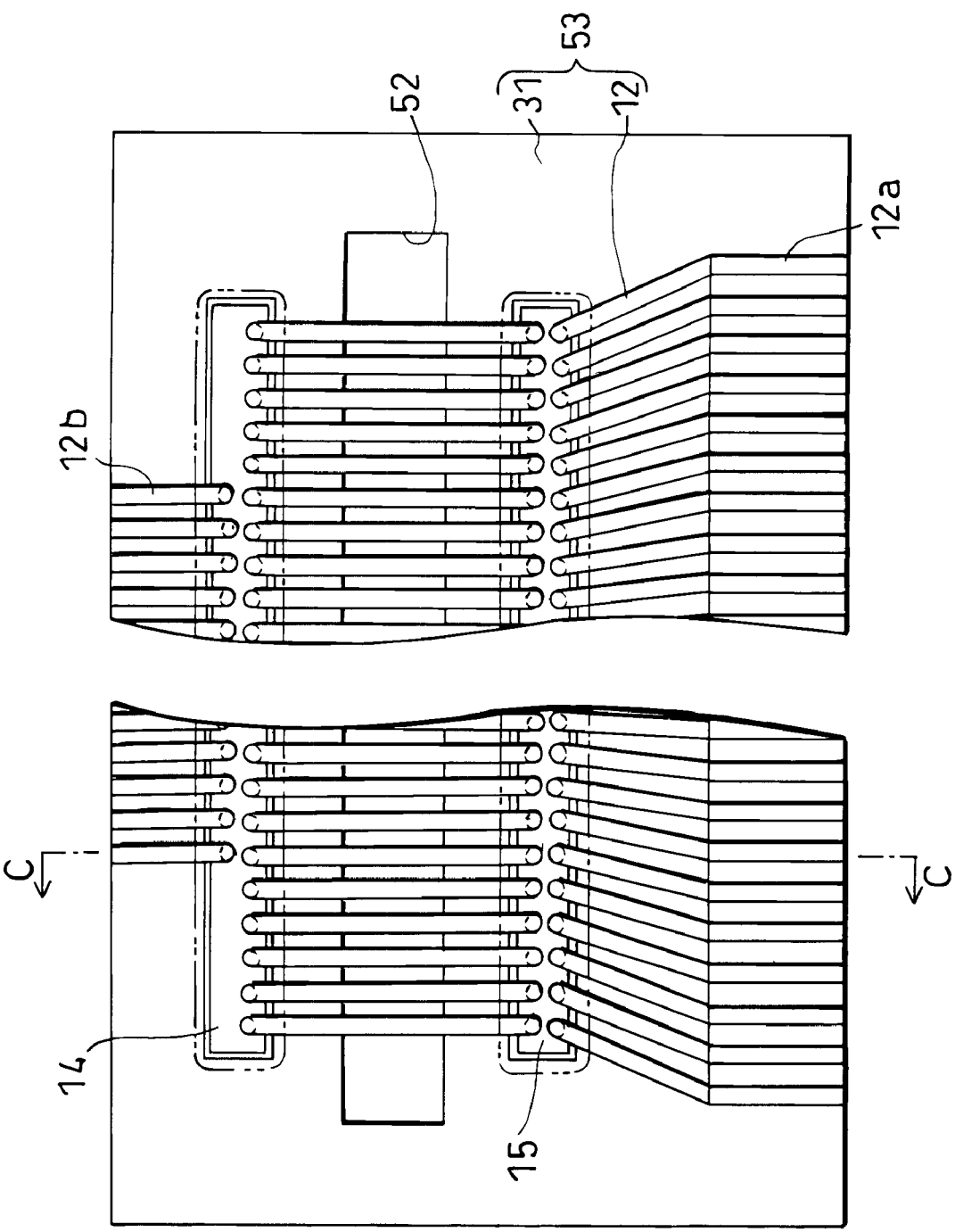
FIG. 10 is a front view of a semiconductor device according to a Fifth Embodiment of the present invention.
Figure 11:
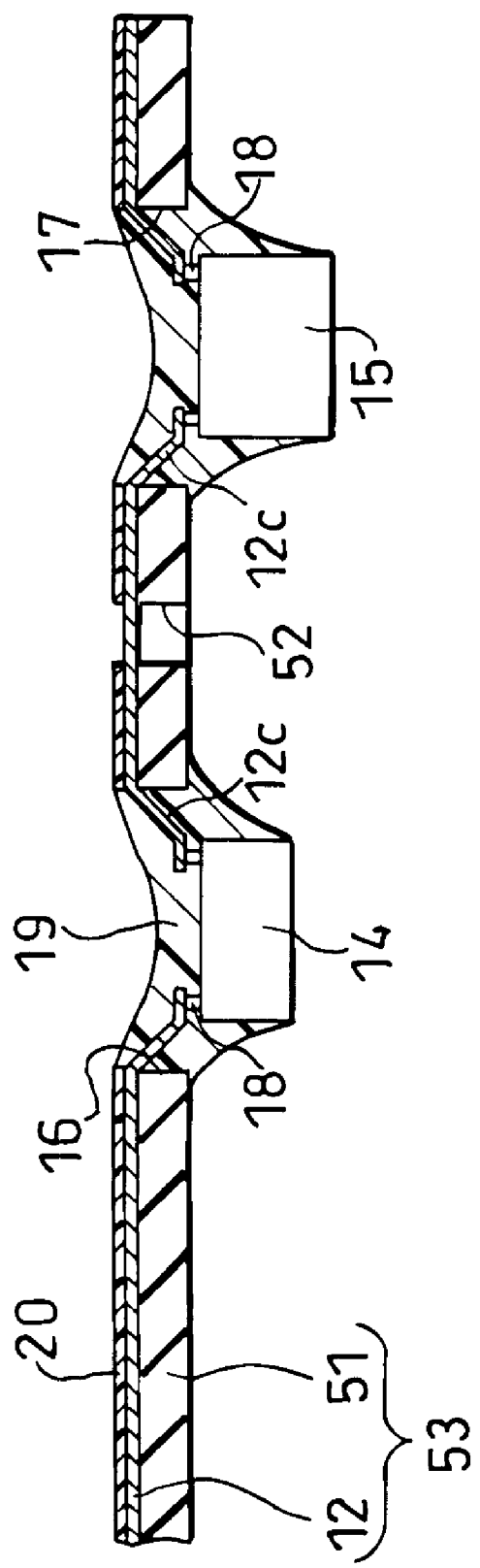
FIG. 11 is a cross sectional view of the semiconductor device of FIG. 10, taken along the line C—C.
Figure 12:
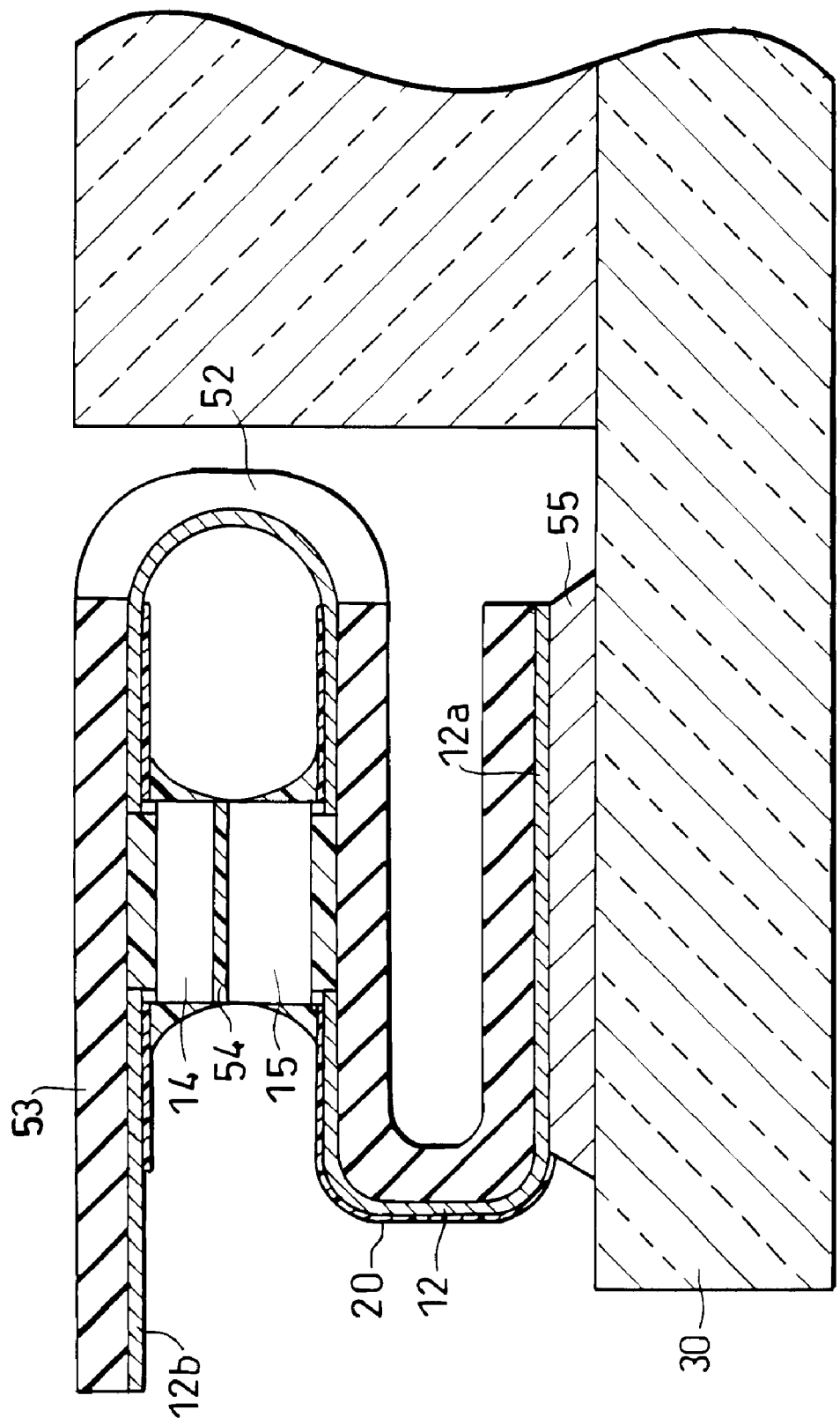
FIG. 12 is a cross sectional view of a liquid crystal module to which the semiconductor device shown in FIGS. 10 and 11 is to be mounted.

The following will explain a Fifth Embodiment of the present invention with reference to FIGS. 10 to 12.

FIG. 10 is a front view of a semiconductor device according to the Fifth Embodiment of the present invention, and FIG. 11 is cross sectional view of this semiconductor device of FIG. 10, taken along a line C—C. The present semiconductor device is similar to the semiconductor device shown in FIGS. 7 and 8, and the corresponding members will be given the same reference numerals, and explanation thereof will be omitted. What should be noted in the present semiconductor device is that the substrate 51 composed of the organic material includes a slit 52 between the semiconductor chips 14 and 15, while providing part of the Cu wiring pattern 12 between the chips 14 and 15 with blank portions where the solder resist 20 is not formed.

The slit 52 and the blank portions are provided so as to enable the tape 53 to be easily bent without impairing the strength, and these are formed along a long-side direction of the semiconductor chips 14 and 15, and have a width of, for example, 100 μm. This enables the tape 53 to be flexibly bent, thereby reducing bending stress with respect to an area around the extending portions 12a and 12b.

With this arrangement, as shown in FIG. 12, the tape 53 can be bent, and bonding back surfaces of the semiconductor chips 14 and 15 with an adhesive 54 greatly reduces an area occupied by the tape 53. FIG. 12 is a cross sectional view of a liquid crystal module on which the semiconductor device shown in FIGS. 10 and 11 is to be mounted, where the tape 53 is bent, thereby greatly contributing to the miniaturization of the liquid crystal module.

Figure 13:
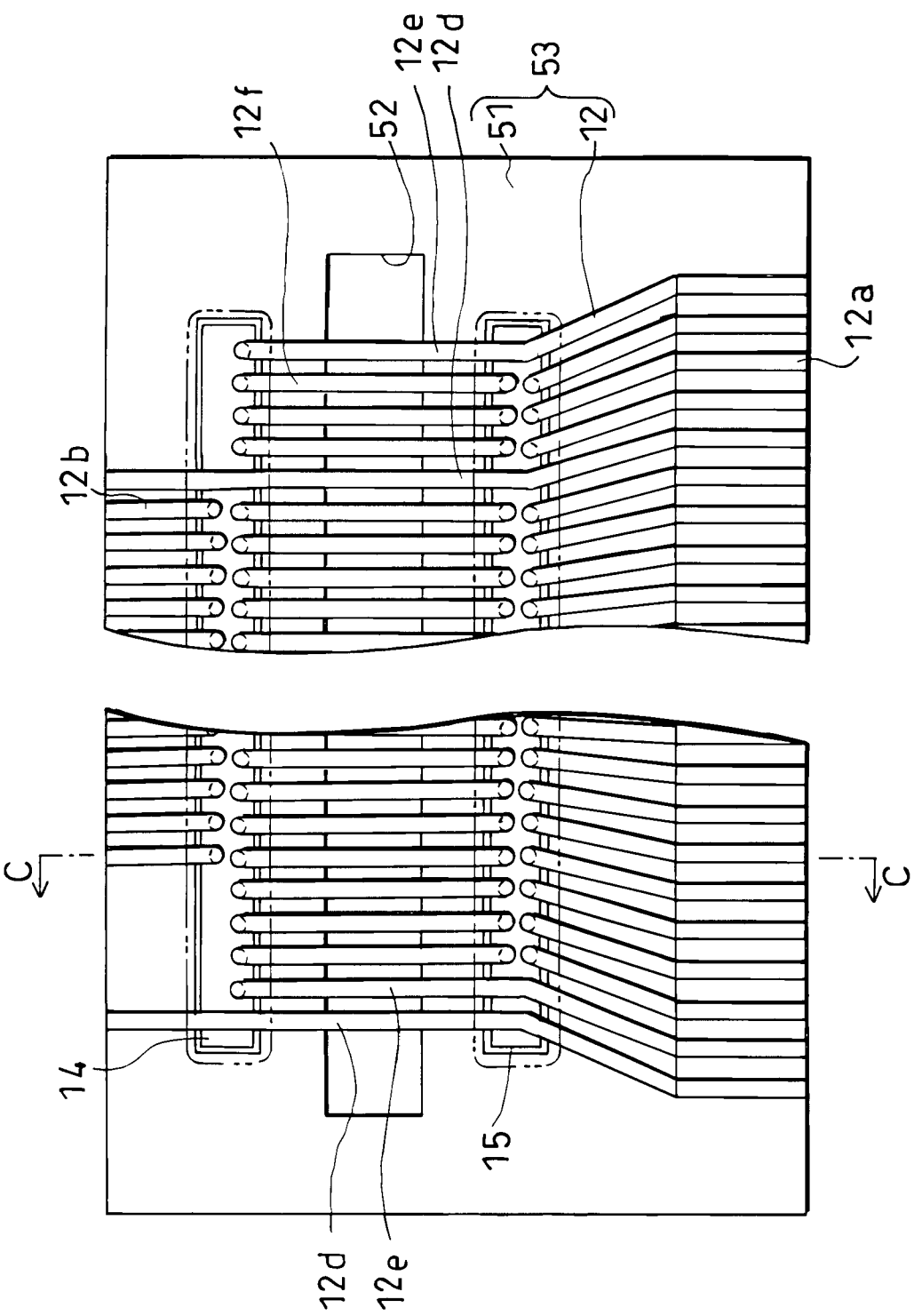
FIG. 13 is a front view of a semiconductor device which is one modification example of the Fifth Embodiment of the present invention.
Figure 14:
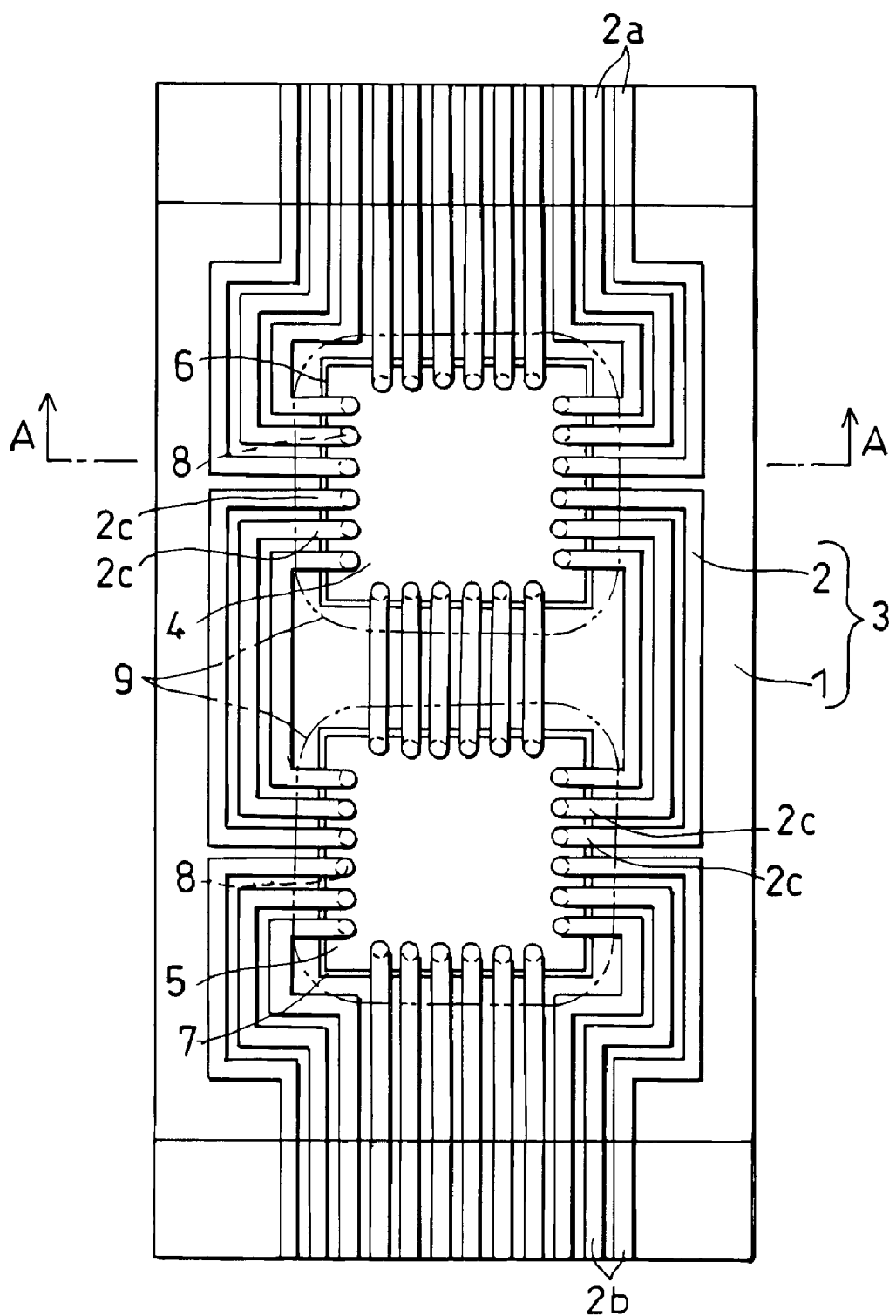
FIG. 14 is a front view for explaining a conventional mounting method for a semiconductor device.
Figure 15:
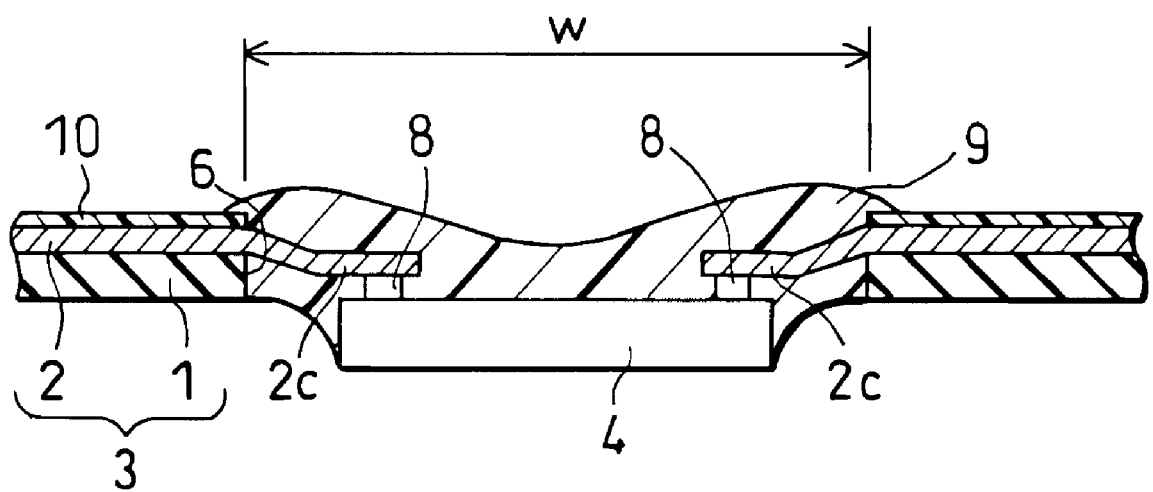
FIG. 15 is a cross sectional view of the semiconductor device of FIG. 14, taken along the line A—A.

Note that, as one modification example of the configuration shown in FIG. 10, a configuration as shown in FIG. 13 is also applicable. FIG. 13 is a front view of a semiconductor device which is a modification example of the Fifth Embodiment of the present invention, and members corresponding to those of the semiconductor device shown in FIG. 10 will be given the same reference numerals, and explanation thereof will be omitted. In the present configuration, among all the Cu wiring pattern 12 on the tape 53, those indicated by a reference numeral 12e are wired across the semiconductor chip 15 so as to be connected to the semiconductor chip 14, and those indicated by a reference numeral 12d are wired a cross the semiconductor chips 14 and 15. By thus partially wiring the Cu wiring pattern 12 across the semiconductor chips 14 and/or 15, various types of wire bound can be attained between in- and output, and between the semiconductor chips 14 and 15. Note that, the number of semiconductor chips across which the Cu wiring pattern 12 is provided may be two or more, which should be selected depending on a circuit layout, as required. More specifically, it needs to be arranged such that the Cu wiring pattern 12 from a semiconductor chip can be connected partially to another semiconductor chip or the outside, through at least one different semiconductor chip. Further, a portion of the Cu wiring pattern 12 as indicated by a reference numeral 12f is to connect the semiconductor chips 14 and 15, which was shown in other drawings such as FIG. 10.

Selection of the adhesive 54 is made in accordance with reference potentials of the semiconductor chips 14 and 15. In order to prevent reduction in electrical performance, an insulating resin is adopted when the semiconductor chips 14 and 15 have different reference potentials, and an electrically conducting resin is adopted when the chips 14 and 15 have the same reference potential. The extending portion 12a of the Cu wiring pattern 12 is electrically and mechanically connected to an electrode of the liquid crystal panel 30, via the anisotropic conductive film 55 and the like.

Note that, a mounting method and the number of chips with regard to the semiconductor chips 14 and 15; 44 are not limited to those explained above, and the same effect is attainable in any embodiments having a configuration according to the present invention.

The embodiments and concrete examples of implementation discussed in the foregoing detailed explanation serve solely to illustrate the technical details of the present invention, which should not be narrowly interpreted within the limits of such embodiments and concrete examples, but rather may be applied in many variations within the spirit of the present invention, provided such variations do not exceed the scope of the patent claims set forth below.

What is claimed is:

1. A semiconductor device, comprising:
   a tape having at organic substrate and a wiring pattern formed on said organic substrate;
   a plurality of semiconductor chips having more than one thickness and being mounted on said tape such that adjacent ones of said semiconductor chips have a difference in thickness, said semiconductor chips individually having a lengthwise rectangular shape and being mounted so as to have each long side substantially perpendicular to an extending direction of said wiring pattern,
   said wiring pattern connecting adjacent ones of said semiconductor chips to each other in a near straight line.

2. The semiconductor device as set forth in claim 1, wherein on said tape is formed a slit between said semiconductor chips, so as to ease bending of said tape.

3. The semiconductor device as set forth in claim 2, wherein said tape is bent, and back surfaces of said semiconductor chips are bonded.

4. The semiconductor device as set forth in claim 3, further comprising an adhesive for bonding back surfaces of said semiconductor chips,
   wherein said semiconductor chips whose back surfaces are to be bonded have different reference potentials, and said adhesive is an insulating resin.

5. The semiconductor device as set forth in claim 3, further comprising an adhesive for bonding back surfaces of said semiconductor chips,
   wherein said semiconductor chips whose back surfaces are to be bonded have the same reference potential, and said adhesive is a conductive resin.

6. The semiconductor device as set forth in claim 1, wherein the wiring pattern between said semiconductor chips is free from a solder resist, so as to ease bending of the tape.

7. The semiconductor device as set forth in claim 1, wherein said semiconductor chips have a lengthwise rectangular shape whose ratio of a long side to a short side is not less than 10.

8. The semiconductor device as set forth in claim 1, wherein said plurality of semiconductor chips include a semiconductor chip subject to ILB bonding.

9. The semiconductor device as set forth in claim 1, wherein said plurality of semiconductor chips include a semiconductor chip subject to flip chip bonding.

10. The semiconductor device as set forth in claim 1, wherein said plurality of semiconductor chips include a semiconductor chip subject to ILB bonding and a semiconductor chip subject to flip chip bonding.

11. The semiconductor device as set forth in claim 1, wherein said semiconductor chips are at least two chips selected from an SRAM, a liquid crystal driver IC and a controller-use IC.

12. A liquid crystal module, comprising the semiconductor device as set forth in claim 11 that is connected to a liquid crystal panel.

13. A semiconductor device, comprising:
   a tape having an organic substrate and a wiring pattern formed on said organic substrate; and
   a plurality of semiconductor chips having more than one thickness and being mounted on said tape such that adjacent ones of said semiconductor chips have a difference in thickness, said semiconductor chips individually having a lengthwise rectangular shape and being mounted so as to have each long side substantially perpendicular to an extending direction of said wiring pattern.

14. A semiconductor device as claimed in claim 13 said wiring pattern including a wiring pattern for connecting said semiconductor chips, and a wiring pattern which connects one of said semiconductor chips to another one of said semiconductor chips or to outside the tape by passing over yet another one of said semiconductor chips.

15. The semiconductor device as set forth in claim 13, wherein on said tape is formed a slit between said semiconductor chips, so as to ease bending of said tape.

16. The semiconductor device as set forth in claim 15, wherein said tape is bent, and back surfaces of said semiconductor ships are bonded.

17. The semiconductor device as set forth in claim 16, further comprising an adhesive for banding back surfaces of said semiconductor chips,
   wherein said semiconductor chips whose back surfaces are to be bonded have different reference potentials, and said adhesive is an insulating resin.

18. The semiconductor device as set forth in claim 16, further comprising an adhesive for bonding back surfaces of said semiconductor chips,
   wherein said semiconductor chips whose back surfaces are to he bonded have the same reference potential and said adhesive is a conductive resin.

19. The semiconductor device as set forth in claim 13, wherein the wiring pattern between said semiconductor chips is free from a solder resist, so as to ease bending of the tape.

20. The semiconductor device as set forth in claim 13, wherein said semiconductor chips have a lengthwise rectangular shape whose ratio of a long side to a short side is no less than 10.

21. The semiconductor device as set forth in claim 13, wherein said plurality of semiconductor chips include a semiconductor chip subject to ILB bonding.

22. The semiconductor device as set forth in claim 13, wherein said plurality of semiconductor chips include a semiconductor chip subject to flip chip bonding.

23. The semiconductor device as set forth in claim 13, wherein said plurality of semiconductor chips include a semiconductor chip subject to ILB bonding and a semiconductor chip subject to flip chip bonding.

24. The semiconductor device as set forth in claim 13, wherein said semiconductor chips are at least two chips selected from an SRAM, a liquid crystal driver IC and a controller-usc IC.

25. The semiconductor device as set forth in claim 1, wherein said wiring pattern includes a wiring pattern for connecting said semiconductor chips, and a wiring pattern which is provided across at least one of said semiconductor chips.

26. A liquid crystal module, comprising the semiconductor device as set forth in claim 25, that is c;onnectcd to a liquid crystal panel.

27. A liquid crystal module, comprising the semiconductor device as set forth in claim 14, that is connected to a liquid crystal panel.

* * * * *